United States Patent
Lemkin et al.

(10) Patent No.: US 8,981,833 B2
(45) Date of Patent: Mar. 17, 2015

(54) METHODS AND CIRCUITS FOR PROVIDING STABLE CURRENT AND VOLTAGE REFERENCES BASED ON CURRENTS FLOWING THROUGH ULTRA-THIN DIELECTRIC LAYER COMPONENTS

(71) Applicant: Dust Networks, Inc., Hayward, CA (US)

(72) Inventors: Mark Alan Lemkin, Berkeley, CA (US); Thor Nelson Juneau, Menlo Park, CA (US)

(73) Assignee: Dust Networks, Inc, Hayward, CA (US)

( * ) Notice: Subject to any disclaimer, the term of this patent is extended or adjusted under 35 U.S.C. 154(b) by 63 days.

(21) Appl. No.: 13/666,916

(22) Filed: Nov. 1, 2012

(65) Prior Publication Data

US 2014/0118034 A1    May 1, 2014

(51) Int. Cl.

| | |
|---|---|
| *G05F 1/567* | (2006.01) |
| *G05F 1/575* | (2006.01) |
| *H03L 5/02* | (2006.01) |
| *G05F 3/24* | (2006.01) |
| *H01L 29/94* | (2006.01) |

(52) U.S. Cl.
CPC .. *H03L 5/02* (2013.01); *G05F 3/24* (2013.01); *H01L 29/94* (2013.01); *Y10S 323/907* (2013.01)
USPC ............ 327/513; 327/543; 323/315; 323/907

(58) Field of Classification Search
None
See application file for complete search history.

(56) References Cited

U.S. PATENT DOCUMENTS

| | | | |
|---|---|---|---|
| 5,612,641 A * | 3/1997 | Sali ............................... | 327/143 |
| 5,883,798 A | 3/1999 | Yamaguchi | |
| 6,265,749 B1 * | 7/2001 | Gardner et al. ............... | 257/410 |
| 6,452,440 B2 * | 9/2002 | Rapp ............................. | 327/543 |
| 6,747,492 B2 * | 6/2004 | Govil et al. ................... | 327/143 |
| 6,917,319 B1 | 7/2005 | Abadeer et al. | |
| 7,034,587 B2 * | 4/2006 | Marotta ........................ | 327/143 |
| 7,342,408 B2 * | 3/2008 | Kim ......................... | 324/762.08 |
| 7,710,760 B2 * | 5/2010 | Yip ............................... | 365/149 |
| 2002/0005749 A1 | 1/2002 | Descombes | |
| 2003/0082842 A1 * | 5/2003 | Hwu et al. ...................... | 438/54 |

(Continued)

OTHER PUBLICATIONS

Lee et al., Modeling CMOS tunneling currents through ultrathin gate oxide due to conduction- and valence-band electron and hole tunneling vol. 48 , Issue: 7 , IEEE Transactions on Electron Devices, pp. 1366-1373, Jul. 2001.

(Continued)

*Primary Examiner* — Lincoln Donovan
*Assistant Examiner* — Terry L Englund
(74) *Attorney, Agent, or Firm* — McDermott Will & Emery, LLP

(57) ABSTRACT

Low-power circuits for providing stable voltage and current references rely on currents flowing through ultra-thin dielectric layer components for operation. A current reference circuit includes driving circuitry operative to apply a voltage to the first terminal of the component with respect to the second terminal of the component in order to cause a current to flow through the dielectric layer, and sources a reference output current that is based on the current flow through the dielectric layer in response to the applied voltage. A voltage reference circuit includes a current source which applies a current to the ultra-thin dielectric layer component, and maintains an output node at a stable reference output voltage level based on the voltage across the ultra-thin dielectric layer component in response to the current flow through the dielectric layer.

20 Claims, 13 Drawing Sheets

(56) References Cited

U.S. PATENT DOCUMENTS

2008/0169837 A1  7/2008  Abadeer et al.
2008/0169869 A1  7/2008  Abadeer et al.

OTHER PUBLICATIONS 0.25 μm CMOS Process, FC025, FAB d-Signal Foundry Expersts, 0.25 Micron CMOS Technology, Data Sheet FC025, Rev. 1.1, Jun. 2008.

65 nanometer, From Wikipedia, the free encyclopedia, http://en.wikipedia.org/wiki/65_nanometer.

Johan et al., "Analog Circuits in Ultra-Deep-Submicron CMOS", IEEE Journal of Solid-State Circuits, 40 (1), Jan. 2005, pp. 132-143.

Ivanov., "An Ultra Low Power Bandgap Operational at Supply 0.75 V", 2011 Proceedings of the ESSCIRC (ESSCIRC), pp. 515-523, Sep. 12-16, 2011.

Lin et al., "A sub-pW timer using gate leakage for ul-tra low-power sub Hz monitoring systems", IEEE 2007 Custom Intergrated Circuits Conference (CICC), pp. 397-400.

Extended European Search Report issued in European Application No. EP 12007509.8 dated Oct. 21, 2013.

* cited by examiner

METHODS AND CIRCUITS FOR PROVIDING STABLE CURRENT AND VOLTAGE REFERENCES BASED ON CURRENTS FLOWING THROUGH ULTRA-THIN DIELECTRIC LAYER COMPONENTS

CROSS-REFERENCE TO RELATED APPLICATION

The present application claims the benefit of priority from U.S. Provisional Patent Application Ser. No. 61/555,309, entitled "LOW POWER CIRCUITS AND TECHNIQUES" and filed on Nov. 3, 2011, which is hereby incorporated by reference in its entirety for all purposes.

TECHNICAL FIELD

The present subject matter relates to techniques and equipment to provide stable current and voltage references that are insensitive to variations in operating conditions. The subject matter further relates to providing low-power references based on currents, such as leakage currents, flowing through ultra-thin dielectric-layer components.

BACKGROUND

Many circuits benefit from reduced power consumption. This is particularly the case for devices which operate on scavenged power, such as thermally-harvested energy (via a Peltier, thermocouple, or similar device), vibration-harvested energy (through a magnet and coil, or piezoelectric transducer, for example), or photoelectric-harvested energy (via a solar cell, for example). Circuits which are powered by a battery with an ultra-low self discharge rate, for example the EnerChip solid state batteries sold by Cymbet, also benefit from reduced power consumption.

Current circuit design techniques and devices are limited in their ability to provide high performance at ultra-low bias currents due to intrinsic device behavior. For example, a low power bandgap described in "*An ultra low power bandgap operational at supply as low as* 0.75 *V*" by Vadim Ivanov, et al. ESSCIRC 2011 consumes 200 nA, which is a substantial amount of current for scavenged power supplies. In some applications a continuous current is provided from an energy scavenger, and the energy is stored until a certain threshold sufficient for an operation is reached. Once the threshold is reached, the device wakes up, performs an operation, and then goes back to sleep. Reduced current requirements from supervisory-function circuit blocks such as timers, oscillators, power-on-reset circuits, voltage references, or comparators translate directly into more useful energy for performing desired functionality, such as sending or receiving a packet of data over a radio.

As CMOS technology has decreased in geometry the gate oxide thickness has been continuously reduced. For device geometries below about 0.18 um, gate leakage becomes considerable. Gate leakage from these ultra-deep submicron CMOS processes has been identified as an undesired behavior with many undesirable properties. For example, in a microprocessor, gate-oxide leakage contributes to high standby current. Other applications have identified a minimum frequency below which the transistor no longer provides current gain for certain device dimensions and bias points (see, e.g.: "*Analog Circuits in Ultra-Deep-Submicron CMOS*", IEEE Journal of Solid State Circuits, Vol. 40, No. 1, January 2005, pp. 132-143).

A need therefore exists for circuits that provide high-performance at reduced power consumption, since smaller-sized scavenging power supplies could be used, since devices could be operated in lower intensity conditions (e.g., dim light for solar collection, smaller temperature differences for thermal harvesters), and since additional or improved functionality may be provided as a result of reduced power consumption (e.g., more frequent temperature measurements).

SUMMARY

The teachings herein alleviate one or more of the above noted problems with low-power techniques and equipment to provide stable current and voltage references that are insensitive to variations in operating conditions by using currents flowing through ultra-thin dielectric-layer components to generate the stable references.

In accordance with a first example, a circuit including an ultra-thin dielectric layer component is provided. The component has a first terminal, a second terminal, and an ultra-thin dielectric layer disposed between the first and second terminals such that the first and second terminals contact the dielectric layer and are physically separated from each other. The circuit further includes driving circuitry operative to apply a voltage to the first terminal with respect to the second terminal, in order to cause a unidirectional current to flow through the dielectric layer while the driving circuitry is in operation. In one example, the driving circuitry is a current mirror coupled to the component and configured to source at an output node a reference output current that is based upon (e.g., equal, proportional to, or otherwise functionally related to) the current flow through the dielectric layer.

In various examples, the ultra-thin dielectric layer has a thickness of 3 nm or less; the first and second terminals are formed on opposite sides of the ultra-thin dielectric layer and are spaced apart from each other by the thickness of the dielectric layer; and/or the ultra-thin dielectric layer is formed of at least one of silicon dioxide, silicon nitride, a high-k dielectric material, a low-k dielectric material, hafnium silicate, zirconium silicate, hafnium dioxide, and zirconium dioxide.

In various examples, the ultra-thin dielectric layer component is a transistor, wherein the first terminal is a gate terminal of the transistor, the second terminal is a channel region of the transistor (e.g., a channel region of a transistor in depletion, accumulation, or inversion mode), and the ultra-thin dielectric layer is an ultra-thin gate oxide layer of the transistor. In another example, the ultra-thin dielectric layer component is a MOSCAP or other integrated circuit structure comprising a well formed in a substrate, wherein a first surface of the ultra-thin dielectric layer contacts the well, the first terminal is on a second surface of the dielectric layer opposite the first surface, and the second terminal includes the well. In yet another example, the ultra-thin dielectric layer component is a capacitor structure, wherein the first and second terminals are conductive plates contacting opposite surfaces of the ultra-thin dielectric layer.

In accordance with a second example, a circuit including an ultra-thin dielectric layer component is provided. The component has a first terminal, a second terminal, and an ultra-thin dielectric layer disposed between the first and second terminals such that the first and second terminals contact the dielectric layer and are physically separated from each other. The circuit further includes a current source coupled to the component and configured to apply a current to the first terminal of the component to cause the current to flow from the first terminal through the dielectric layer to the second terminal. The circuit operates such that the component provides a reference output voltage between the first and second terminals in response to the current flow through the dielectric layer.

In various examples, the current source of the circuit includes a differential amplifier circuit, wherein the output of the differential amplifier is configured to control the current source such that a voltage across an impedance coupled to an output of the differential amplifier tracks the voltage at the first terminal of the component. In one example, the circuit is coupled to an oscillator circuit, wherein the oscillator circuit comprises a current reference generator circuit coupled to the first terminal and configured to generate a stable current reference proportional to the reference output voltage provided by the component, and circuitry configured to generate an oscillator output signal by cyclically charging a capacitor using the stable current reference. In another example, the circuit is coupled to a power-on-reset circuit coupled to the first terminal of the component and configured to generate a power-on-reset output signal in response to detecting that a power supply level exceeds the reference output voltage at the first terminal of the component.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various circuits and methods disclosed herein relate to providing stable current and voltage references that are insensitive to variations in circuit operating conditions such as temperature. The circuits and methods further provide low-power current and voltage references, such as current and voltage references based on leakage currents of ultra-thin dielectric-layer components.

The circuits and methods provide stable current and voltage references that output currents/voltages having relatively constant and invariable amplitude values. The current and voltage references are designed to maintain stable outputs independently of variations in circuit and ambient temperatures, changes in circuit load or power supply voltage, and/or any other changes in circuit operating conditions. For example, in some embodiments, a reference circuit may provide an output current with an amplitude that varies by no more than 100 pA over a range of operating temperatures from −40 Celsius to +85 Celsius, or provide an output voltage with an amplitude that varies by no more than 10 mV over a range of power supply values from +2 Volts to +3.6 Volts or no more than 10 mV over a range of operating temperatures from −40 Celsius to +85 Celsius. In addition, the circuits and methods can provide stable reference currents with very low amplitudes (e.g., in the range of 50-130 pA). In some embodiments the reference circuits provide stable reference voltage or currents using circuitry operating using very low bias currents with amplitudes as low as 50-130 pA or lower, and total reference circuit current consumptions in the order of a few nA (e.g., 1-10 nA).

Reference now is made in detail to the examples illustrated in the accompanying drawings and discussed below.

Figure 1A:
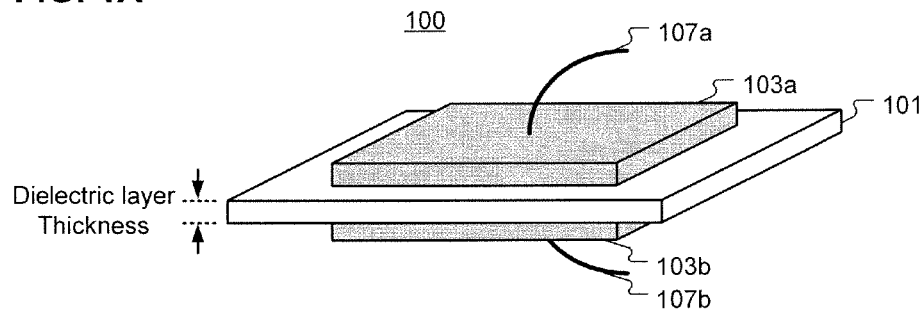
FIGS. 1A-1C are simplified schematic diagrams showing structures of illustrative ultra-thin dielectric layer components.

FIG. 1A shows an illustrative ultra-thin dielectric layer component 100. The ultra-thin dielectric-layer component 100 is formed of at least one ultra-thin dielectric layer 101 separating two electrical contacts 103a, 103b coupled to respective component terminals 107a, 107b. The electrical contacts 103a, 103b are formed of conductive materials, such as appropriately doped silicon, polysilicon, metal depositions or conductive plates such as capacitor plates, or the like. The electrical contacts are generally formed on opposite surfaces of the ultra-thin dielectric layer 101, such that the contacts are separated from each other by a minimum distance equal to a thickness of the ultra-thin dielectric layer. In particular, the two electrical contacts do not contact each other, but each is in contact with the ultra-thin dielectric layer. In some examples, the ultra-thin dielectric layer has additional terminals.

The ultra-thin dielectric layer can be formed of any of a variety of dielectric substance, and in various examples may be formed of silicon dioxide, silicon oxide (e.g., a dielectric including a silicon oxide that is not a 1:2 ratio of silicon to oxygen), silicon nitride, a high-k dielectric material, a low-k dielectric material, hafnium silicate, zirconium silicate, hafnium dioxide, hafnium oxide, zirconium dioxide, or another appropriate type of dielectric. The thickness of the ultra-thin dielectric layer is generally limited to be less than 3 nm (e.g., in a range of 1-3 nm, such as a thickness of 1.9 nm on an n-type substrate or 2.1 nm on a p-type substrate). In some examples, however, the thickness can be limited to be less than 1 nm. Other dielectric layer thicknesses may also advantageously be used, including thicknesses of more than 3 nm. In general, in a dielectric layer shaped as a cuboid having rectangular faces (such as that shown in FIG. 1A), the thickness of the dielectric layer may correspond to the smallest dimension of the layer (as shown illustratively in component 100 of FIG. 1A). In examples in which the dielectric layer is a cuboid, the two electrical contacts may be formed such that they each contact at least part of (or substantially all of) respective opposite surfaces of the cuboid that are separated from each other by the thickness dimension. The thickness of the dielectric layer may be set based on the material of the dielectric layer so as to provide conduction of non-negligible current through the dielectric layer when a normal operating voltage is applied across the layer.

In operation, the ultra-thin dielectric layer allows tunneling of charge carriers (e.g., electrons and/or holes) through the dielectric layer from one electrical contact to the other electrical contact in response to a voltage or current being applied between the contacts. In some examples, the charge carriers tunnel through the dielectric layer in a relationship characterized by one or more current vs. voltage curves such as those shown in FIG. 1E. In general, however, charge carriers tunnel though the dielectric layer when standard integrated circuit operating voltages (e.g., in the range of 100 mV-5 V) or currents (e.g., in the range of 1 pA-100 mA) are applied between the contacts.

Figure 1B:
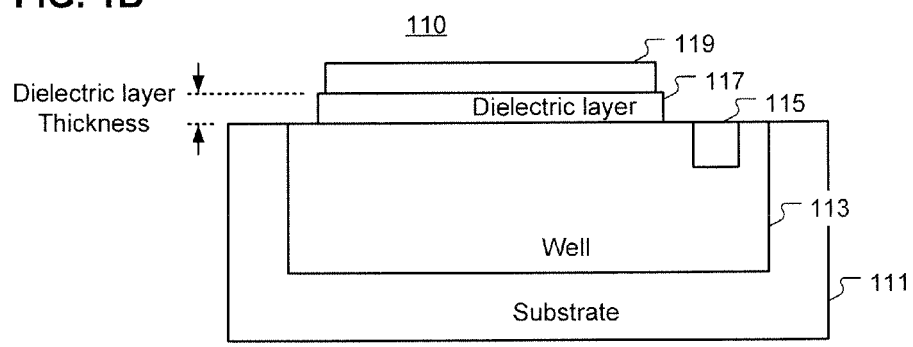
Figure 1C:
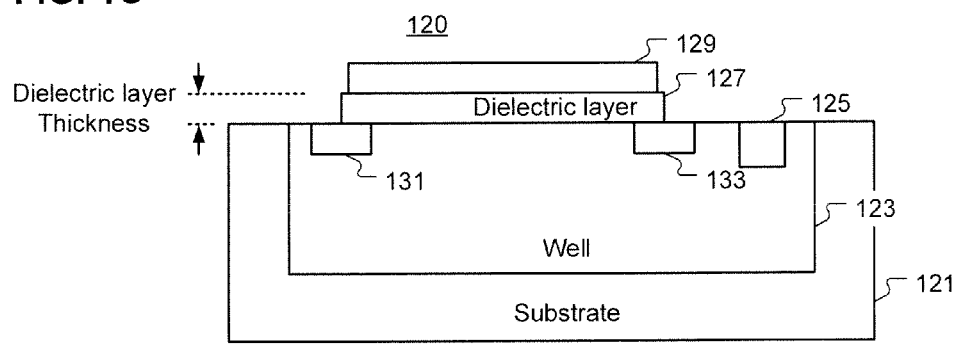

FIGS. 1B and 1C illustratively show cross-sections of two illustrative ultra-thin dielectric layer components 110 and 120 formed in integrated circuit substrates. The components may be formed, for example, in Ultra-Deep Submicron CMOS (UDSCMOS) processes. The component 110 of FIG. 1B may be referenced as a MOSCAP, while the component 120 of FIG. 1C may be referenced as an ultra-thin gate oxide transistor.

The component 110 of FIG. 1B is formed in a substrate 111 (e.g., a p-type substrate), and includes an ultra-thin dielectric layer 117 formed on the surface of the substrate. A first contact is formed of a doped region or well 113 (e.g., an n-well) extending below and contacting the dielectric layer 117, and of a diffusion region 115 (e.g., an n+ diffusion) forming a contact to the doped region or well. A first electrical terminal can be coupled to the doped region or well 113 and/or diffusion region 115 to serve as one terminal of the component 110. A second contact is formed of a conductor 119 (e.g., a conductor such as metal, polysilicon, or salicided or silicided polysilicon) formed on an upper surface of the dielectric layer 117. A second electrical terminal can be coupled to the conductor 119 to serve as another terminal of the component 110. In some embodiments, the component 110 is formed directly in the substrate 111 (e.g., an n-doped substrate) without the presence of a well 113, the first contact is formed of a region of the doped substrate 111 extending below and contacting the dielectric layer 117, and the first contact is set to a substrate potential of the substrate 111.

The component 120 of FIG. 1C is formed in a substrate 121 (e.g., a p-type substrate), and includes an ultra-thin dielectric layer 127 formed on the surface of the substrate. A first contact is formed of a doped region or well 123 (e.g., an n-well) extending below and contacting the dielectric layer 127, of a diffusion region 125 (e.g., an n+ diffusion) forming a contact to the doped region or well and serving as a body terminal, and of two additional diffusion regions 131, 133 (e.g., p+ diffusions) serving as drain and source terminals. A first terminal of the component 120 corresponds to the channel region of the transistor (the region of the doped region or well 123 that is below the dielectric layer 127), and can be formed of the interconnection of the body, drain, and source terminals to serve as one terminal of the component 120. A second contact is formed of a conductor 129 (e.g., a conductor such as metal, polysilicon, or salicided or silicided polysilicon) formed on an upper surface of the dielectric layer 127 and serving as a gate terminal. A second electrical terminal of the component 120 can be coupled to the gate terminal conductor 129 to serve as another terminal of the component 120. In some embodiments, the component 120 is formed directly in a region of the doped substrate 121 without the presence of a well 123, the first contact is formed of a channel region of the substrate 121 extending below and contacting the dielectric layer 127.

While the components 110 and 120 have each been described as being formed in p-type substrates, the components 110 and 120 can alternatively be formed in n-type substrates. In an example, the component 110 would include a p-type doped region or p-well 113 and a p+ diffusion 115 while the component 120 would include a p-type doped region or p-well 123, a p+ diffusion 125, and n+ diffusions 131 and 133.

Ultra-thin dielectric layer components (such as components 100, 110, or 120) exhibit a relationship between a gate voltage and a gate current, and are such that the gate current is of a non-negligible quantity due at least in part to the tunneling of charge carriers through the dielectric layer. For example, core transistor 120 or MOSCAPs 110 formed in a 130 nm, 90 nm, 65 nm, or any other appropriate integrated circuit fabrication technology may exhibit such non-negligible gate currents. In some embodiments the mechanism for the gate current is electron tunneling. In some embodiments the mechanism for the gate current is hole tunneling. In some embodiments the mechanism for the gate current is direct tunneling of a carrier across the dielectric barrier. Tunneling is a behavior described by quantum mechanics. Many technologies have multiple gate oxide thicknesses, such that an integrated circuit may include one or more core components with thin gate oxides, and one or more I/O components with thicker gate oxides able to handle higher voltages for device inputs and outputs. These thicker gate-oxide components have substantially reduced gate leakage.

Figure 1D:
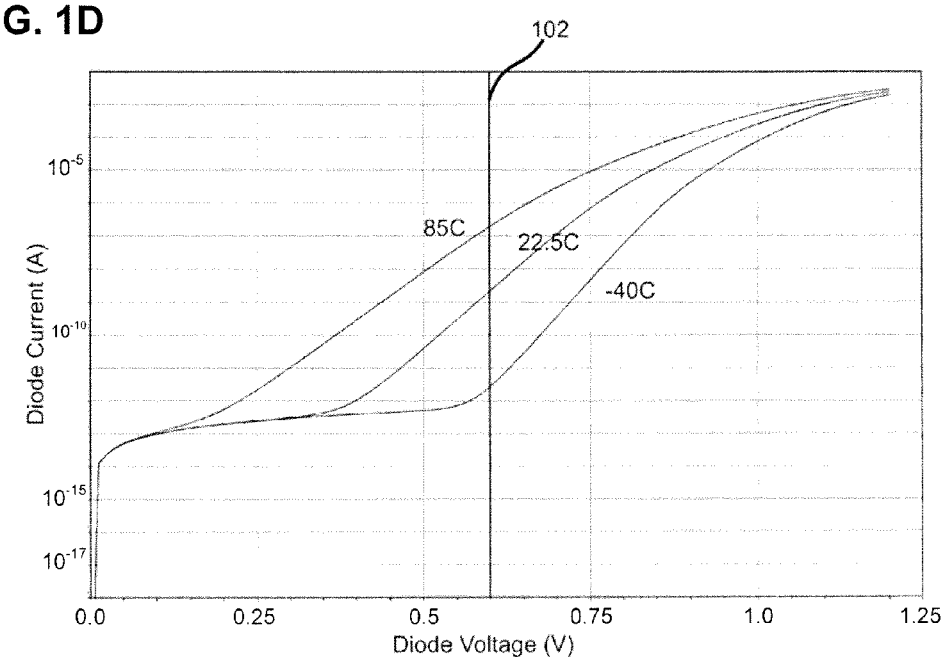
FIG. 1D is a graph illustrating simulated current versus voltage of a diode.
Figure 1E:
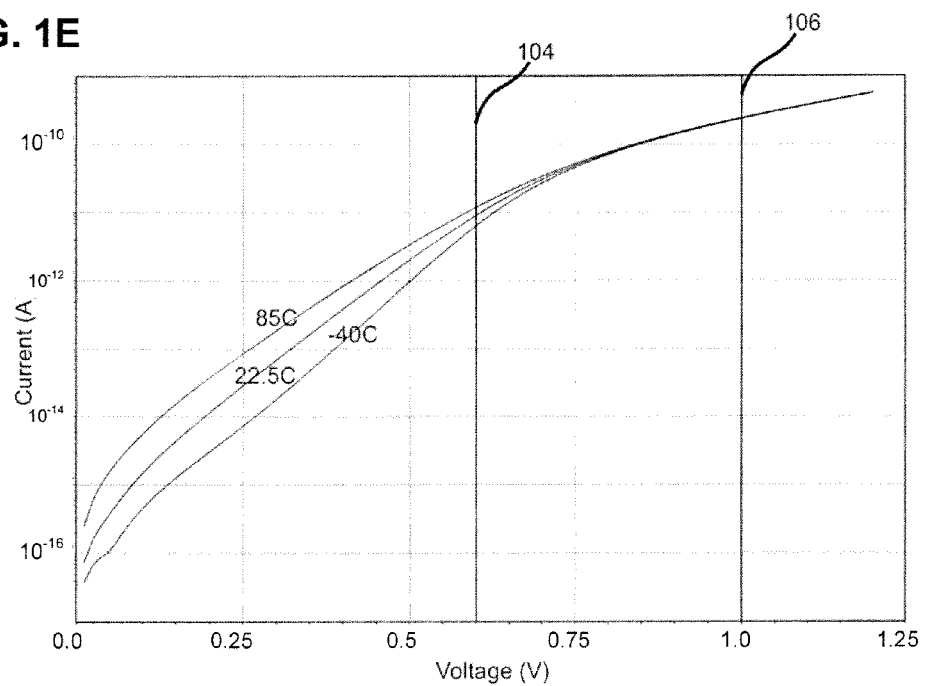
FIG. 1E is a graph illustrating simulated gate current versus gate-source voltage for an ultra-thin dielectric layer component taking the form of an ultra-thin gate oxide transistor.

FIG. 1D is a graph illustrating simulated current versus voltage of a diode. In the example shown in FIG. 1D, current is plotted vs. voltage for a 1 um×1 um silicon p-n junction diode at three temperatures: −40 C, 22.5 C, 85 C. FIG. 1E is a graph illustrating simulated gate current versus gate-source voltage for an ultra-thin gate oxide transistor such as component 120. In the example shown in FIG. 1E, the drain, source, and body terminals are tied to zero potential for a 1 um×1 um core (1.2V) high-VT NMOS transistor fabricated in a 65 nm CMOS process at three temperatures: −40 C, 22.5 C, and 85 C. Several important differences may be noted from FIG. 1D and FIG. 1E. First, for a constant forward voltage, there is a substantial variation in the diode current as the temperature varies. For example, referring to bias point 102, with a forward voltage of 600 mV the diode current rises almost five orders of magnitude as the temperature varies. However, FIG. 1E shows that for a constant forward voltage, the gate current of the ultra-thin dielectric layer transistor component doesn't even double at bias point 104, and changes by less than 5% at bias point 106. The relatively low temperature variation of the ultra-thin dielectric layer transistor's gate-current/gate-voltage transfer characteristic may be used to generate a reference with good temperature stability at ultra-low currents compared to a reference using a junction component such as a diode or a bipolar transistor. Another difference between FIG. 1D and FIG. 1E is that the slope of the current vs. forward voltage for the diode is much steeper than the slope of the current vs. forward voltage for the ultra-thin dielectric layer transistor component. Since the slope of the diode is steep, the useful operating range of the diode for low-power applications is substantially reduced as compared to the ultra-thin dielectric layer transistor component because the forward diode current quickly becomes prohibitively large for a fixed reference voltage output. Note that while bandgap references typically use bipolar junction transistors (BJTs), BJTs typically perform poorly at very high and very low current densities. Thus, BJTs may not be well suited for low-power applications.

Figure 2A:
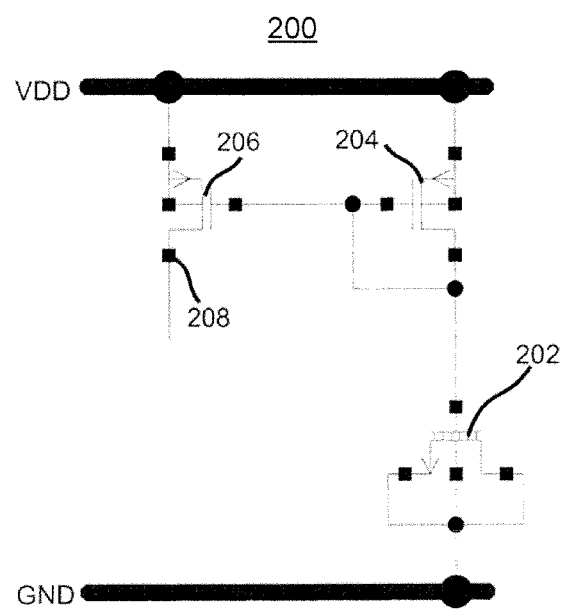
FIG. 2A is a schematic diagram illustrating an embodiment of a low-power current reference circuit including an ultra-thin dielectric layer component.

In some embodiments the gate leakage of an ultra-thin dielectric layer component is used for biasing a circuit. FIG. 2A is a schematic diagram illustrating an embodiment of a low-power current reference circuit 200 operative to produce at an output node 208 a reference output current that is proportional to (or otherwise based on) the current flow through the ultra-thin dielectric layer component 202. In the example shown, a bias current is generated by ultra-thin dielectric-layer core component 202 in response to a driving circuit applying a voltage across the component 202. The driving circuit includes a PMOS current mirror coupled to the component and comprising devices 204 and 206. Diode-connected transistor 204 applies a voltage to a first terminal of component 202 (e.g., the gate of transistor 202) thereby causing a current to flow across the dielectric of component 202. In general, the voltage applied by the transistor 204 to the first terminal is a voltage having a constant amplitude/value while the current mirror is active, which causes a current to flow through the dielectric layer in a unidirectional direction from the transistor 204 to the ground node (or lower power supply node) through the dielectric layer component. The output of the circuit is taken at drain 208 of PMOS transistor 206, where a reference output current proportional to the current flow through the component 202 is sourced. In general, if transistors 204 and 206 have the same dimensions, the current sourced at node 208 generally tracks the current flowing through component 202 (and may have the same current amplitude as the current flowing through component 202); more generally, however, if transistors 204 and 206 have different dimensions, the current sourced at node 208 is proportional to the current flowing through component 202 and the proportionality constant is determined by the ratio of sizes of transistors 204 and 206. Note that the voltage applied to component 202 is generally of constant polarity and, therefore, current through component 202 flows in only one direction during operation of reference circuit 200. That is, during operation of reference circuit 200, the current flow through component 202 flows from the gate of 202 through the ultra-thin dielectric layer to the channel when the circuit is powered.

In some embodiments devices 204 and 206 are fashioned from PMOS transistors with gate oxides that are thicker than the ultra-thin gate oxide of component 202, such that gate leakage currents in the current mirror transistors 204 and 206 are negligible when compared to the reference current levels. For example, in a 65 nm process, which typically has multiple gate oxide thicknesses to optimize core and I/O device performance, component 202 may utilize a 1.2V gate oxide while PMOS current mirror devices 204 and 206 may utilize 2.5V transistor gate oxides. Component 202 is coupled between the drain node of device 204 and one of a ground node (as shown in FIG. 2A) or a lower power supply.

While the component 202 of FIG. 2A is illustratively shown as an ultra-thin dielectric layer transistor component having source, drain, and body terminals coupled together, the component 202 can more generally be any ultra-thin dielectric-layer component. For example, the component 202 may be any of components 100, 110, or 120, or any interconnection of two or more of such components in series and/or in parallel.

Figure 2B:
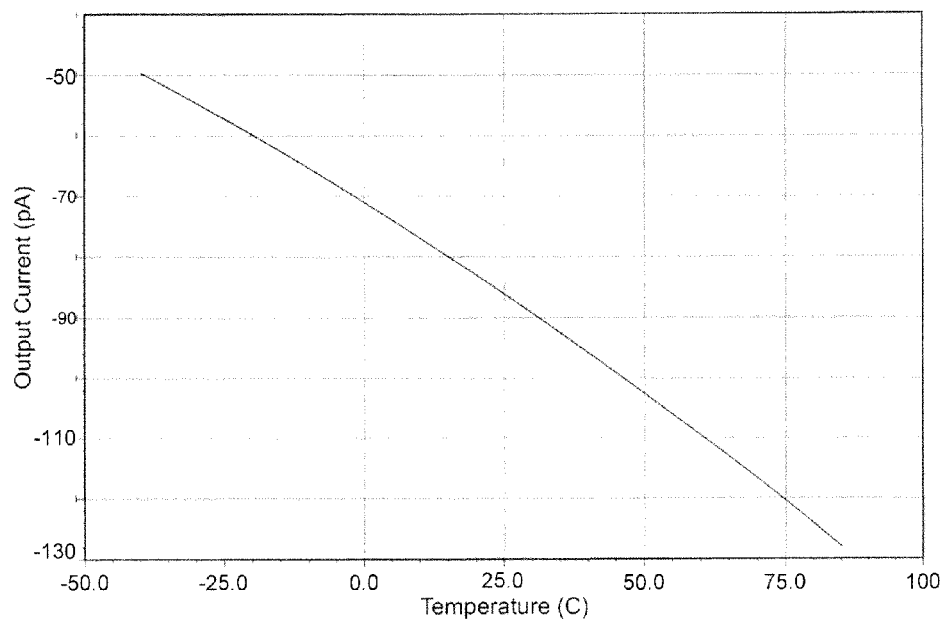
FIG. 2B is a graph illustrating a simulated output current versus temperature characteristic of the circuit of FIG. 2A.

FIG. 2B is a plot illustrating simulated output current produced by current source 200 versus temperature. In the plot, the negative current refers to current being sourced out of the drain of transistor 206. In the example shown, device 202 is a 1 um/1 um 1.2V high-VT NMOS transistor having an ultra-thin gate oxide, and devices 204 and 206 are 0.32 um/10 um 2.5V low-leakage PMOS transistors in a 65 nm CMOS process. The power supply voltage is fixed with a constant voltage of 1.2V across nodes VDD (i.e., the upper power supply) and GND (i.e., the lower power supply). Note that the current variation of this circuit is good over temperature, especially considering the small area it occupies and the low bias current output. Providing accurate bias currents at the nA or pA level is very useful for low-power circuit design. For example, the output of this current source may be used to bias an operational amplifier, an oscillator, a comparator or any other appropriate type of circuit.

Figure 2C:
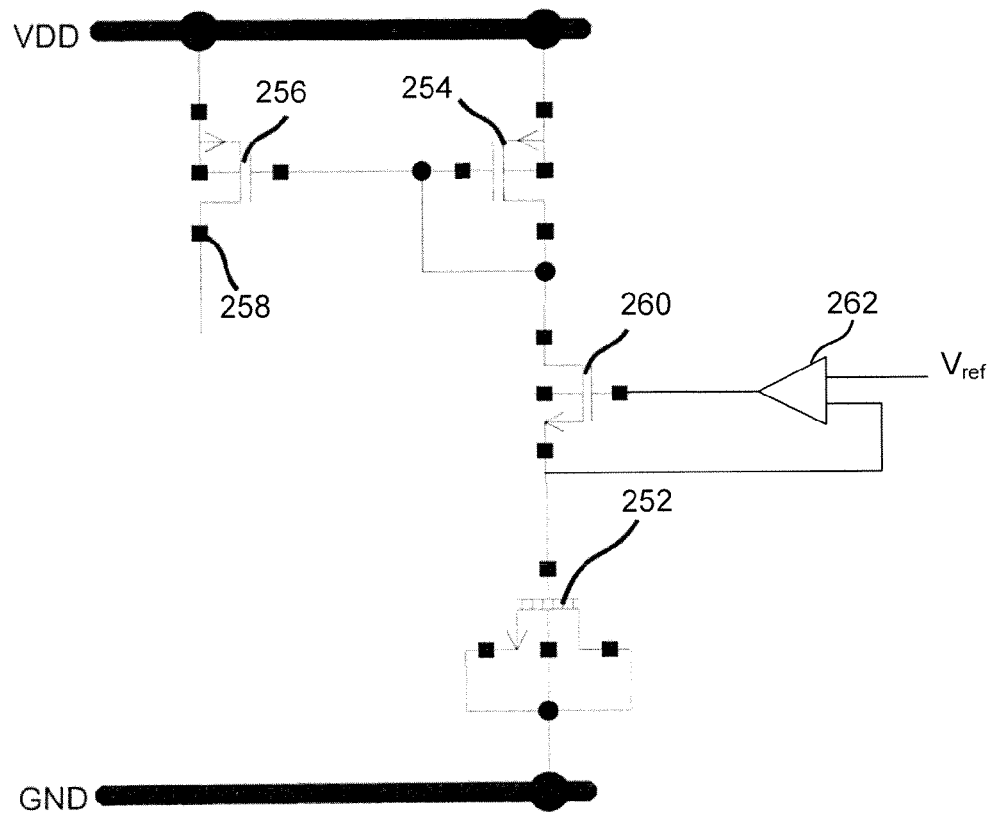
FIG. 2C is a schematic diagram illustrating an embodiment of a low-power current reference circuit including an ultra-thin dielectric layer component.

FIG. 2C is a schematic diagram illustrating an embodiment of a low-power current reference circuit 250 operative to produce at an output node 258 a reference output current that is proportional to (or otherwise based on) the current flow through the ultra-thin dielectric layer component 252. In the example shown, component 252 and transistors 254, 256, and 258 are respectively similar to and function analogously to elements 202, 204, 206, and 208 of circuit 200. As such, description of these components will not be repeated. Circuit 250, however, additionally includes buffer 262 receiving an input voltage level $V_{ref}$ at an input node. The buffer 262 is operative to set the voltage at the first terminal of component 252 to $V_{ref}$ by controlling the gate voltage of source follower transistor 260. A bias current is thus generated through ultra-thin dielectric-layer core component 252 in response to the input voltage level $V_{ref}$ being applied across its terminals. The bias current is mirrored by transistors 254 and 256, and a current proportional to the current through element 252 is sourced at node 258. In general, the input reference voltage $V_{ref}$ is a voltage having a constant amplitude/value while the current mirror is active, which causes a current to flow through the dielectric layer in a unidirectional direction.

Figure 3A:
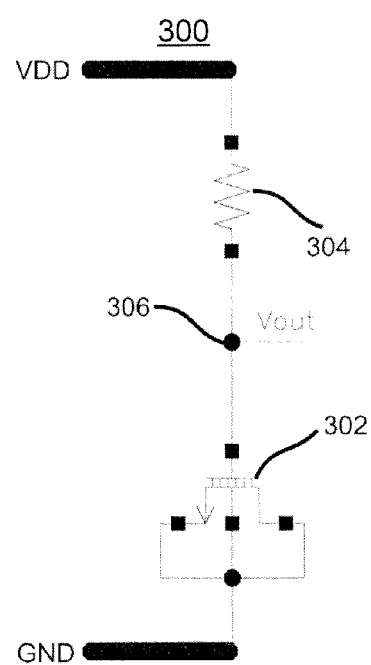
FIG. 3A is a schematic diagram illustrating an embodiment of a low-power voltage reference circuit including an ultra-thin dielectric layer component.
Figure 3B:
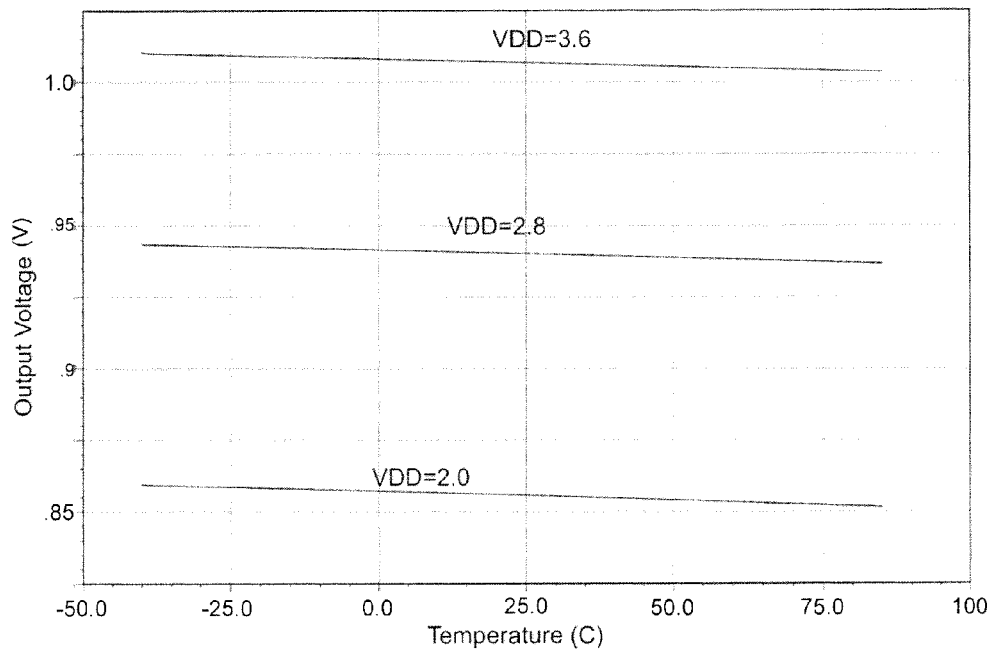
FIG. 3B is a graph illustrating a simulated voltage versus temperature characteristic of the circuit of FIG. 3A as supply voltage is stepped.

In some embodiments the characteristic relationship between gate leakage current and gate voltage between terminals of the ultra-thin dielectric layer component is used to provide a voltage reference. FIG. 3A is a schematic diagram illustrating an embodiment of a low-power voltage reference circuit 300. In the example shown, the voltage reference circuit 300 utilizes an ultra-thin dielectric layer component 302 connected at node 306 to current source 304 implemented as an impedance device such as a resistor. The current source coupled to the component 302 applies a current to the component 302 to cause a current to flow through the dielectric layer to a ground node (as shown) or a lower power supply node. The current flow through the component 302 produces a reference output voltage $V_{out}$ across the terminals of the component 302. FIG. 3B is a graph illustrating simulated voltage versus temperature as the supply voltage VDD is stepped. In the example shown, the reference output voltage $V_{out}$ for a fixed supply voltage of 2.8V changes approximately 6.5 mV as temperature varies from −40 C to 85 C. At a fixed temperature of 25 C the reference output voltage $V_{out}$ changes 151 mV as the supply voltage VDD varies from 2V to 3.6V. In some embodiments current source 304 comprises a resistor with a value greater than 10 MOhms which has quite small dimensions in a deep-submicron process.

Figure 4A:
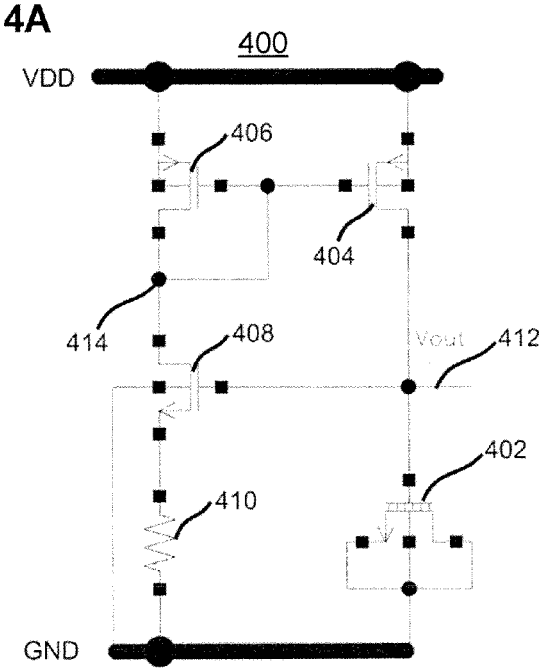
FIG. 4A is a schematic diagram illustrating an embodiment of a low-power voltage reference circuit including an ultra-thin dielectric layer component.

In some embodiments, the characteristic relationship between gate leakage current and gate voltage with respect to another terminal of the ultra-thin dielectric layer component is used to produce a stable voltage reference. FIG. 4A is a schematic diagram illustrating an embodiment of a low-power voltage reference circuit 400. In the example shown, the voltage reference circuit 400 utilizes core (1.2V) ultra-thin dielectric layer component 402 (illustratively shown as an NMOS transistor) coupled in series with a current source circuit. The current source circuit includes a PMOS current mirror comprising 2.5V transistors 404 and 406, 2.5V native NMOS source-follower transistor 408, and an impedance device 410 (such as a resistor). The current source circuit produces at the drain of transistor 404 a current that is proportional to (or equal to, in examples in which transistors 404 and 406 have the same dimensions) the current flowing through the impedance device 410. The current source applies the current to the first terminal of component 402, to cause the reference output voltage $V_{out}$ to be produced across the terminals of component 402.

The circuit 400 uses a feedback loop to improve the output voltage stability produced at output node 412 over temperature. The output voltage at node 412 applies a voltage to impedance device 410 which generates a current that is mirrored via PMOS transistors 404 and 406 to core component 402. Because changes in current from the resistor result in only small changes in reference voltage, this circuit provides a substantially constant reference voltage over temperature. In some embodiments a temperature coefficient of the impedance device 410 and/or of the source-follower transistor 408 is used to provide improved temperature performance by causing the current through component 402 to vary with temperature in a manner that compensates for variations in the current/voltage relationship of component 402 over temperature. In addition, this circuit has good supply rejection as the device 404 and device 408 drop excess supply voltage over their drain/source terminals; as a result, changes (and/or noise) in the supply voltage level may result in only small changes in the reference voltage level. In some embodiments a startup circuit is not included and startup occurs based on device leakage currents. In some embodiments a small current is injected into node 412 or node 414 to ensure that a stable undesired operating point does not exist. In some embodiments the startup current may be removed after startup has occurred.

Figure 4B:
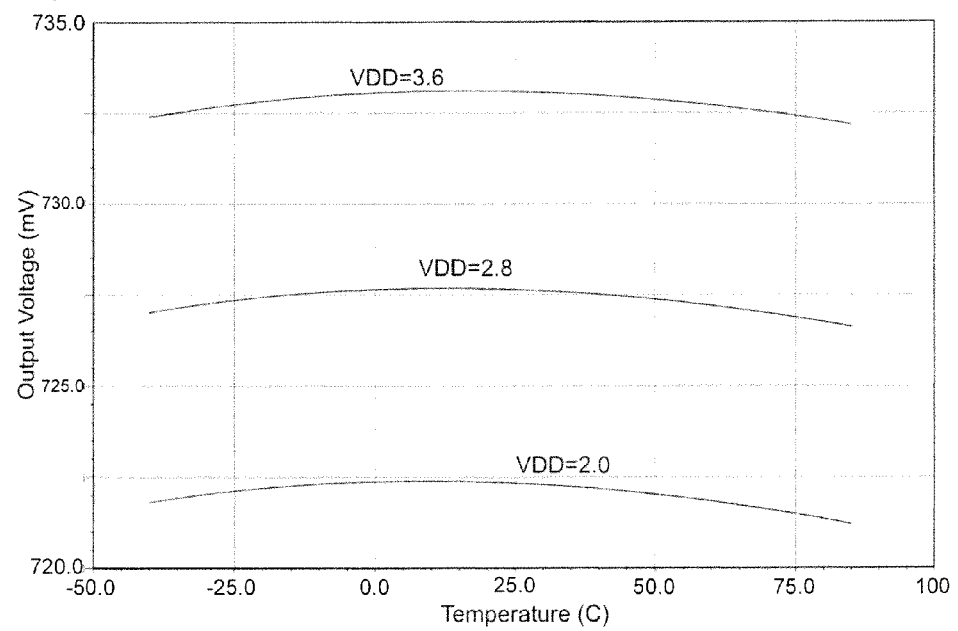
FIG. 4B is a graph illustrating simulated voltage versus temperature characteristic of the circuit of FIG. 4A as supply voltage is stepped.

FIG. 4B is a graph illustrating simulated voltage versus temperature as supply voltage is stepped. In the example shown, the output voltage at node 412 for a fixed supply voltage of 2.8V changes approximately 1.1 mV as temperature varies from −40 C to 85 C. At a fixed temperature of 25 C the output voltage changes 10.7 mV as the supply voltage VDD varies from 2V to 3.6V. Further improvements in power supply rejection may be attained by additional cascoding of devices 404 and 408. The simulated current consumption of approximately 4.8 nA is exceptionally low for such a stable reference.

Figure 5A:
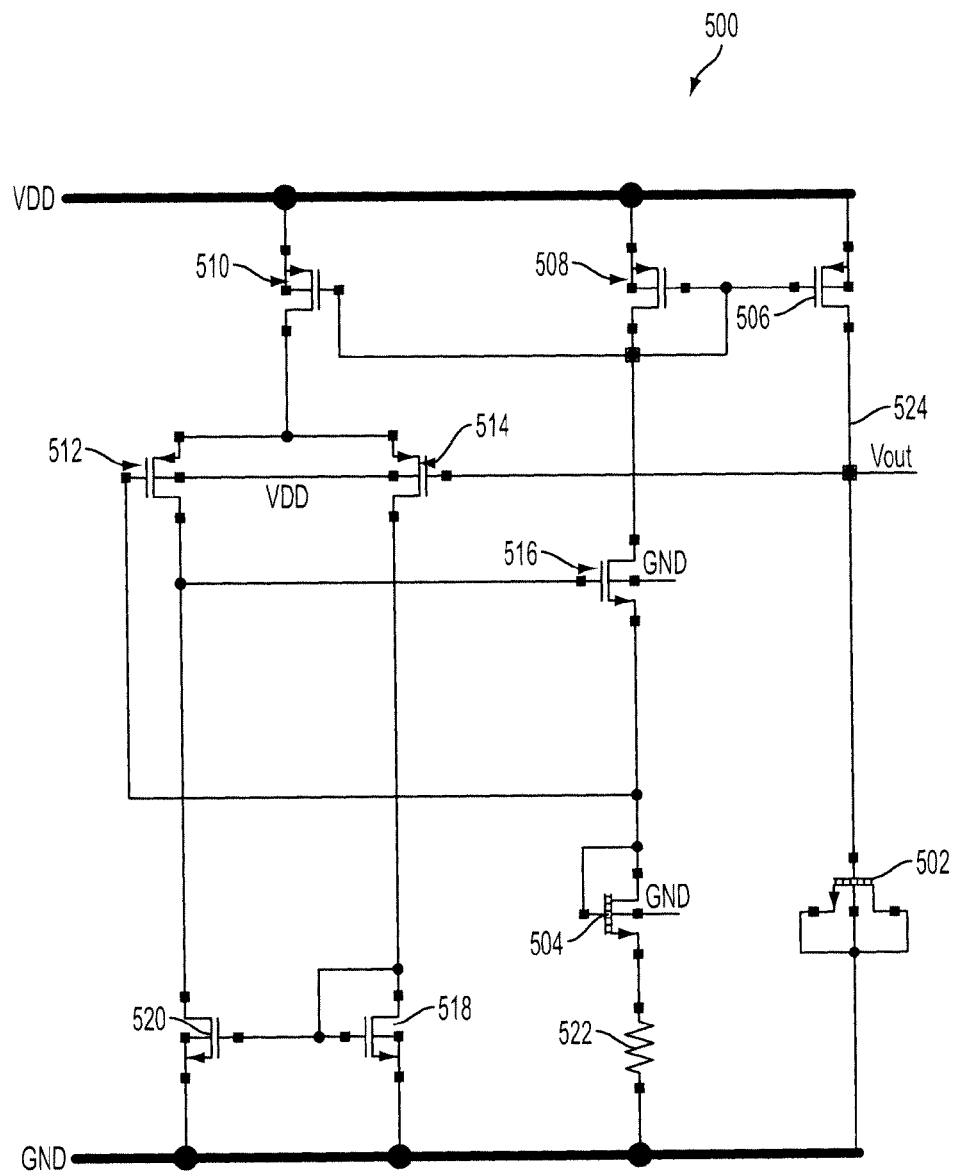
FIG. 5A is a schematic diagram illustrating an embodiment of a low-power voltage reference circuit including an ultra-thin dielectric layer component.

In some embodiments, a correction factor is applied to a reference voltage generated using the gate-leakage to gate voltage characteristic in order to further compensate for variations in the output reference voltage (or current) due to changes in temperature and/or power supply related operating conditions. FIG. 5A is a schematic diagram illustrating an embodiment of a low-power reference circuit 500. The circuit 500 includes a current source (transistors 506, 508) producing at the drain of transistor 506 a current that mirrors the current flowing through an impedance device (formed, in circuit 500, of the interconnection of 504 and 522). The current source applies the current to the first terminal of component 502, to cause the reference output voltage $V_{out}$ to be produced across the terminals of component 502.

In the example shown, active feedback is provided by a differential amplifier comprising 2.5V transistors 512, 514, 518, 520, and 516. The differential amplifier has first and second input nodes at the gate terminals of transistors 512 and 514, and produces an output signal at the source node of transistor 516. Current source 510, which mirrors the current produced by the current source formed of transistors 506 and 508, biases the amplifier by (optionally) scaling and mirroring the current through PMOS transistor 508. In some embodiments a compensation capacitor is tied between the drain of NMOS 520 or the drain of 504 and a supply rail to stabilize the amplifier. An impedance element, such as one formed of core ultra-thin dielectric layer component 504 in series with resistor 522, is coupled between the source of transistor 516 and ground and serves to adjust the resistor current as the temperature varies.

In operation, the differential amplifier is configured to maintain equal the voltage at its first and second input nodes. In doing so, the differential amplifier controls the current source (506, 508) such that the voltage across the impedance element (formed of the series interconnection of 504 and 522) tracks the voltage across the component 502. Since the threshold voltage of component 504 is reduced as the temperature rises, current through the resistor 522 increases, partially cancelling out the voltage drop at the reference output node 524 caused by the temperature characteristic of core component 502 in response to the rise in temperature.

Figure 5B:
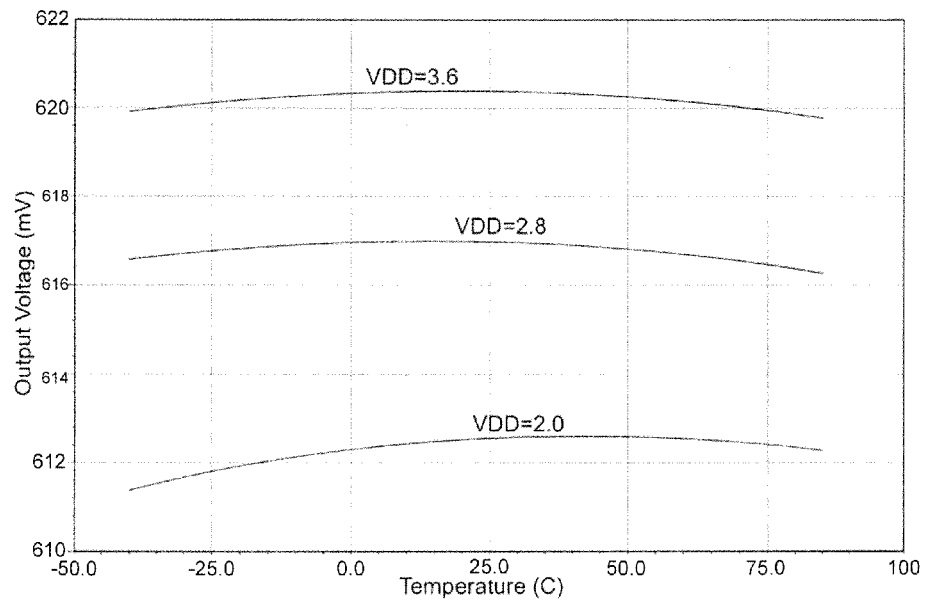
FIG. 5B is a graph illustrating simulated voltage versus temperature characteristic of the circuit of FIG. 5A as supply voltage is stepped.

FIG. 5B is a graph illustrating simulated voltage versus temperature as supply voltage is stepped. In the example shown there is a temperature variation of less than 500 uV at 2.8V supply, and a variation from 2V to 3.6V of only 8 mV at 25 C. The current consumption of the reference of FIG. 5B is exceptionally low for such a stable reference, measuring 2.4 nA at 25 C.

In general, components 502 and 504 can each be formed of one or more ultra-thin dielectric layer components such as any of components 100, 110, or 120. In various embodiments, component 504 is of the same type as component 502 (for example, they are both 1.2V transistor devices); component 504 is of a different type than component 502 (for example, component 504 is a 2.5V device or a PMOS device). In some embodiments other means of communicating the output voltage to the current generating stack is used, for example a simple source-follower circuit, instead of an amplifier.

In some embodiments, in addition to the first-order correction term provided by the circuitry of FIG. 5A, a second order correction term is applied to a reference similar to the reference of FIG. 5A. A second order correction term may be generated by first subtracting a current proportional or inversely proportional to temperature from a constant or relatively constant current and squaring the resulting difference current. The squared difference current is added or subtracted, as appropriate, from the nominal current to the reference core for improved temperature accuracy. In some embodiments a second order correction term is generated in the voltage domain, as opposed to a current domain. In some embodiments third- or higher-order correction terms are applied for improved reference performance.

Figure 6A:
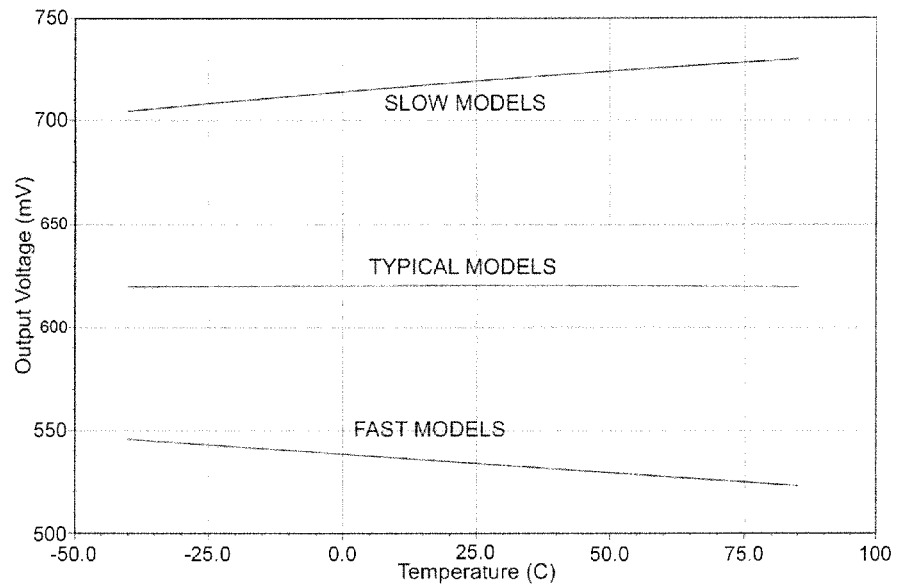
FIGS. 6A-6C are graphs illustrating simulated voltage versus temperature characteristics of the circuit of FIG. 5A as models are varied, as trim is applied with respect to a minimum temperature coefficient, and as trim is applied for a constant output voltage at a temperature.
Figure 6B:
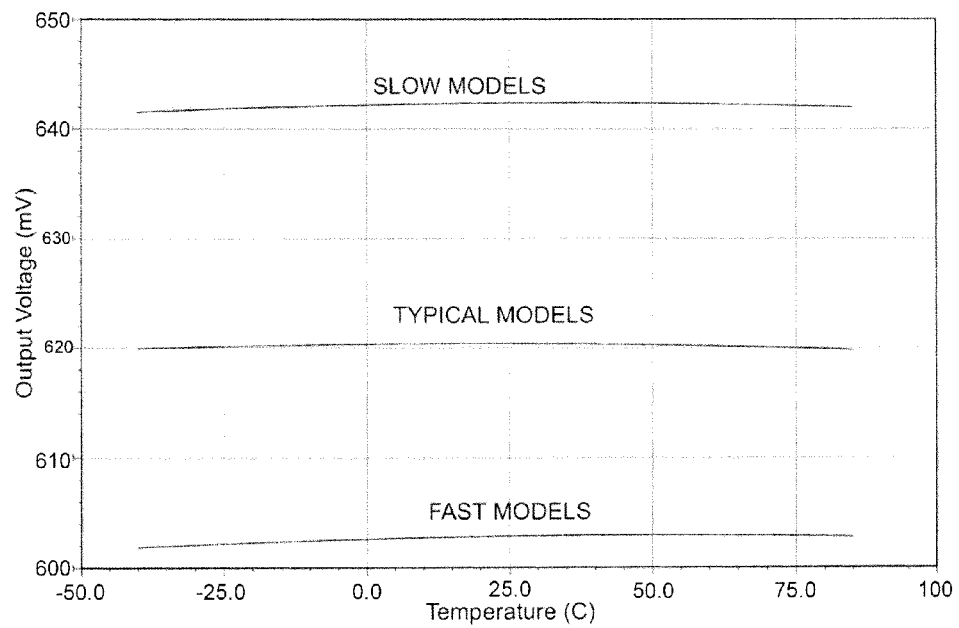
Figure 6C:
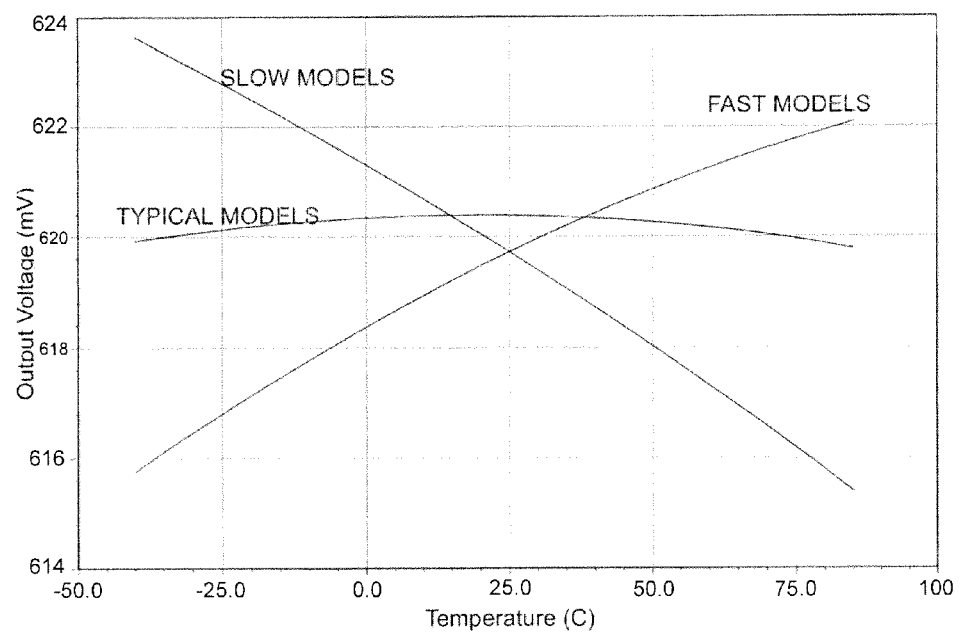

Process variation may affect the ultra-thin dielectric layer thickness, gate-oxide thickness, or threshold voltage of the various transistors within a circuit, thereby causing variation in the circuit behavior from device to device. In some embodiments a voltage or current is measured at a time of manufacture (e.g., using a wafer probe or final test) and used to adjust a characteristic of the circuit to improve a performance metric. FIG. 6A is a graph illustrating simulated voltage versus temperature as models are varied. In the example shown, the temperature performance of an embodiment of the circuit of FIG. 5A is simulated with slow, typical, and fast models for the core transistors and ultra-thin dielectric layer components. As the process varies, the nominal output voltage shifts substantially: a shift greater than 200 mV from slow models to fast models. For fixed, slow models a simulated temperature variation of about 25 mV is observed. FIG. 6B is a graph illustrating simulated voltage versus temperature as models are varied with trim for minimum temperature coefficient. In the example shown, the performance of the circuit is trimmed for minimum temperature coefficient by adjusting the value of a resistor similar to resistor 522. In the example, the variation over process of the nominal output voltage at 25 C has been reduced by more than a factor of five, while the variation over temperature for a given curve is about 1 mV. FIG. 6C is a graph illustrating simulated voltage versus temperature as models are varied with trim for an approximately constant output voltage at 25 C. In the example shown, the variation over process and temperature of the trimmed output voltage is within +/−4 mV of the nominal value at 25 C. In various embodiments, trim is attained by adjusting a resistor using laser trim; trim is attained by adjusting an effective resistance using transistors as switches to connect or disconnect resistors in an array; trim is attained using a digital-to-analog converter (DAC) to selectively identify resistors to connect or disconnect in an array; trim is attained by adjusting a ratio of transistors in a current mirror (e.g. the current mirror of FIG. 5A comprising 506 and 508) using transistors as switches to connect or disconnect unit transistors in an array; or any other appropriate method of adjustment.

In some embodiments, the value of the digital trim word is determined at a time of manufacture at which point the proper value of trim is associated with the particular unit under test. In various embodiments, circuit trim is associated with the unit under test via digital trim; blowing of metal or polysilicon fuses; laser trimming of metal or polysilicon wires; laser trim of thin film resistors; a nonvolatile memory such as flash or FRAM; one-time programmable memory such as provided by the circuit IP vendor Kilopass; or any other appropriate method.

Figure 7A:
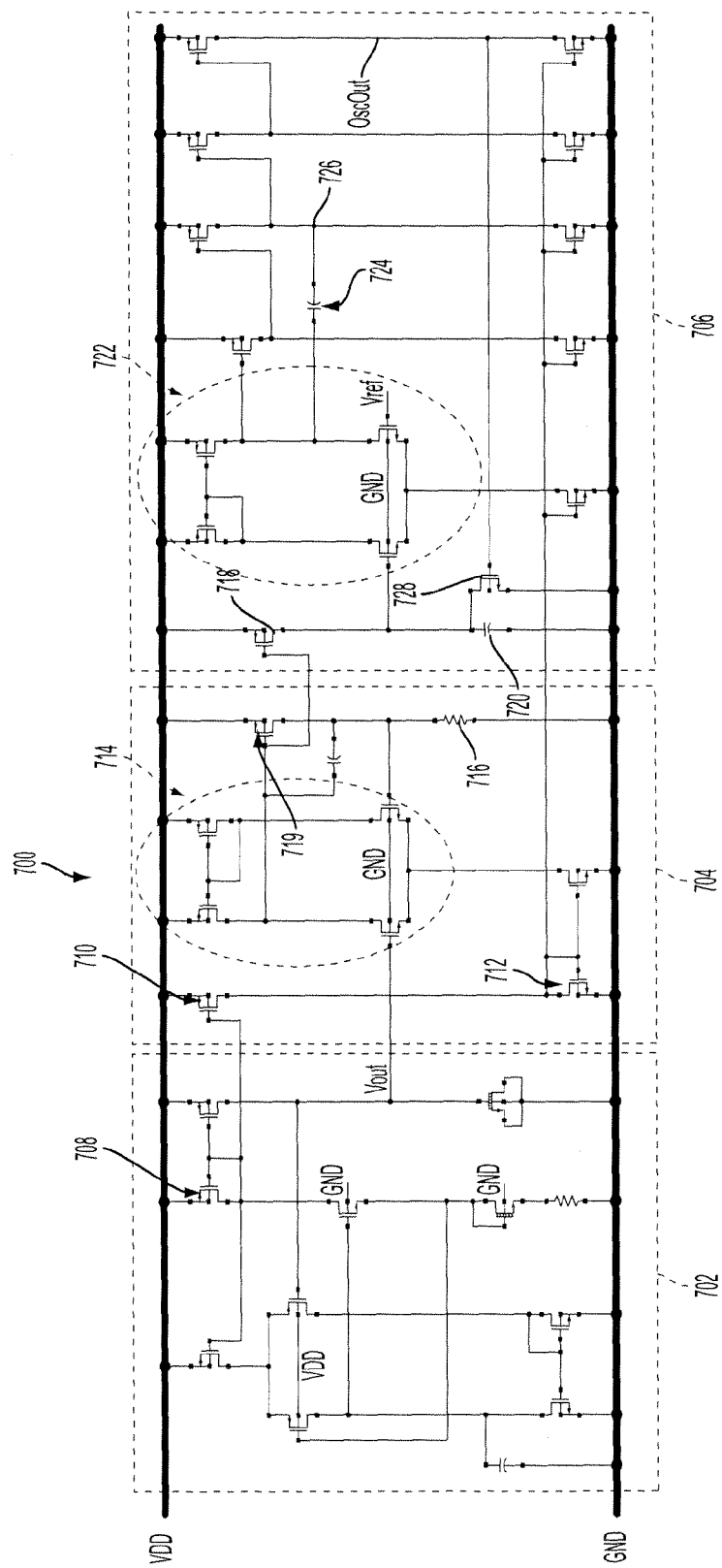
FIG. 7A is a schematic diagram illustrating an embodiment of a low-power oscillator circuit including the low-power voltage reference circuit of FIG. 5A.

In some embodiments, a low-power oscillator uses a gate-leakage to gate-voltage characteristic of one or more ultra-thin dielectric layer component(s) as a reference. FIG. 7A is a schematic diagram illustrating an embodiment of a low-power oscillator 700 using a ultra-thin dielectric layer leakage-current based reference. In the example shown, voltage reference circuit 702, which is similar to circuit 500 of FIG. 5A, in conjunction with current reference generator 704 provides a charging current to oscillator core 706. Current reference generator 704 uses amplifier 714 to force the reference voltage at node $V_{out}$ across resistor 716, so as to produce a stable current reference equal to the current flowing through resistor 716 and transistor 719. A replica transistor 718, which may have the same or a different size from transistor 719, applies a current having an amplitude based on the voltage $V_{out}$ (e.g., proportional to the voltage $V_{out}$) to capacitor 720 which is slowly charged. Comparator 722 compares the voltage on capacitor 720 with a reference voltage $V_{ref}$ and determines when the voltage on capacitor 720 has crossed a threshold equal to the reference voltage $V_{ref}$. In various embodiments the comparator measures a voltage greater than the reference voltage; a voltage equal to the reference voltage; a voltage equal to a fraction of the reference voltage; or any other appropriate level. When the reference voltage threshold is crossed, the comparator 722 outputs a signal at node OscOut causing transistor 728 to rapidly discharge capacitor 720. Once capacitor 720 is discharged, transistor 728 turns off and capacitor 720 is again charged by the current output by transistor 718. Capacitor 720 is thus cyclically charged using the stable current reference, and a precise timing reference can be established based on the time between two charging cycles of the capacitor 720. Feedback capacitor 724 AC couples the voltage at node 726 back to the comparator core (in positive feedback) causing the comparator output slew rate to be faster. The signal at node OscOut may be used to keep track of time or initiate an event, such as causing a microprocessor to wake from a sleep mode.

Figure 7B:
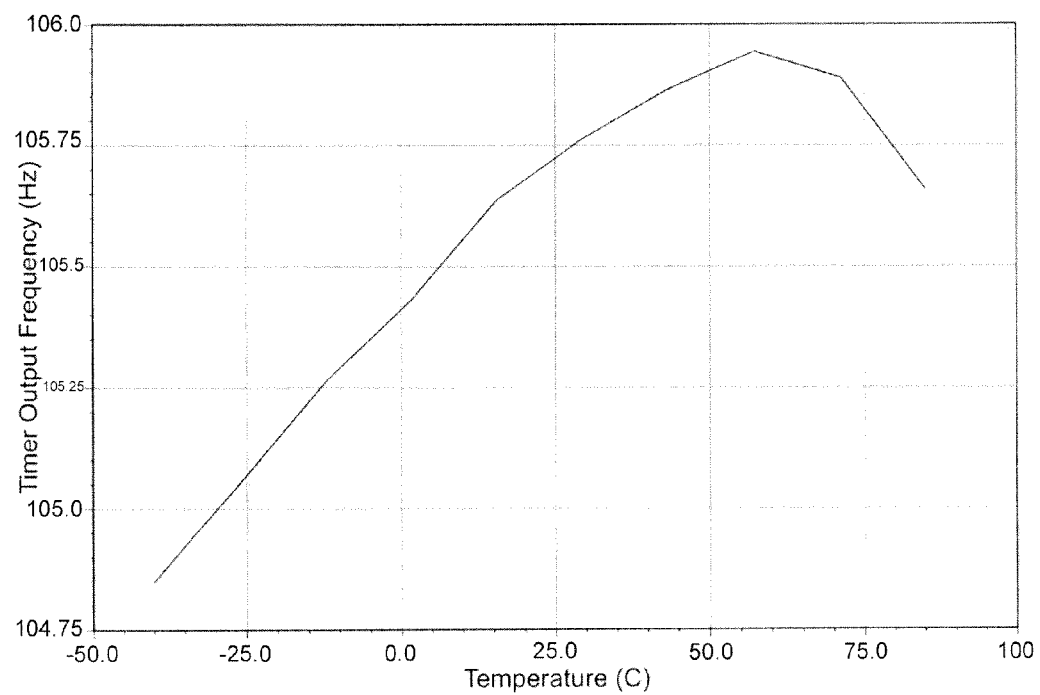
FIG. 7B is a graph illustrating a simulated frequency versus temperature characteristic of the circuit of FIG. 7A.

In various embodiments capacitor 720 is partially discharged, or capacitor 720 is fully discharged, in response to reaching the reference voltage threshold. Because the current levels (such as the current applied by transistor 718) may be made very small, capacitor 720 may be small-valued even for very low output frequencies. The use of a small-valued capacitance saves die area, thereby reducing product cost. The oscillator of FIG. 7A has a simulated current consumption of 7 nA at 3.6V including all three blocks 702, 704, and 706. FIG. 7B is a graph illustrating simulated frequency versus temperature. In the example shown, the total variation over temperature is about 1%, which is particularly good given the low power consumption. In some embodiments the frequency of the oscillator is adjusted by digitally trimming the value of capacitor 720. In some embodiments the frequency of the oscillator is adjusted by digitally trimming the amount of current sourced by transistor 718. A reference for bias currents used in amplifier 714, comparator 722 and the logic recovery circuit between node 726 and node OscOut are generated by a PMOS mirror comprising PMOS transistors 708 and 710 in conjunction with diode-connected NMOS 712. In some embodiments PMOS and NMOS utilize I/O voltage devices (such as a 2.5V device in 65 nm) except for the two core ultra-thin dielectric layer components in reference generator 702 (corresponding to components 502 and 504 of FIG. 5A). In some embodiments the oscillator output at node OscOut is coupled to a counter or a timer to keep track of time or initiate an event after an elapsed amount of time has passed.

In various embodiments a low-power oscillator is trimmed for improved frequency accuracy at a time of manufacture; an oscillator is periodically trimmed in situ by comparing the number of oscillation cycles of the oscillator that occur in a number of cycles of a second oscillator with improved frequency accuracy, such as a quartz crystal oscillator or a MEMS-resonator based oscillator; an oscillator is sporadically (e.g., when a temperature change is determined to exceed a certain amount) trimmed in situ by comparing the number of oscillation cycles of the oscillator that occur in a number of cycles of a second oscillator with improved frequency accuracy, such as a quartz crystal oscillator or a MEMS-resonator based oscillator.

Figure 8A:
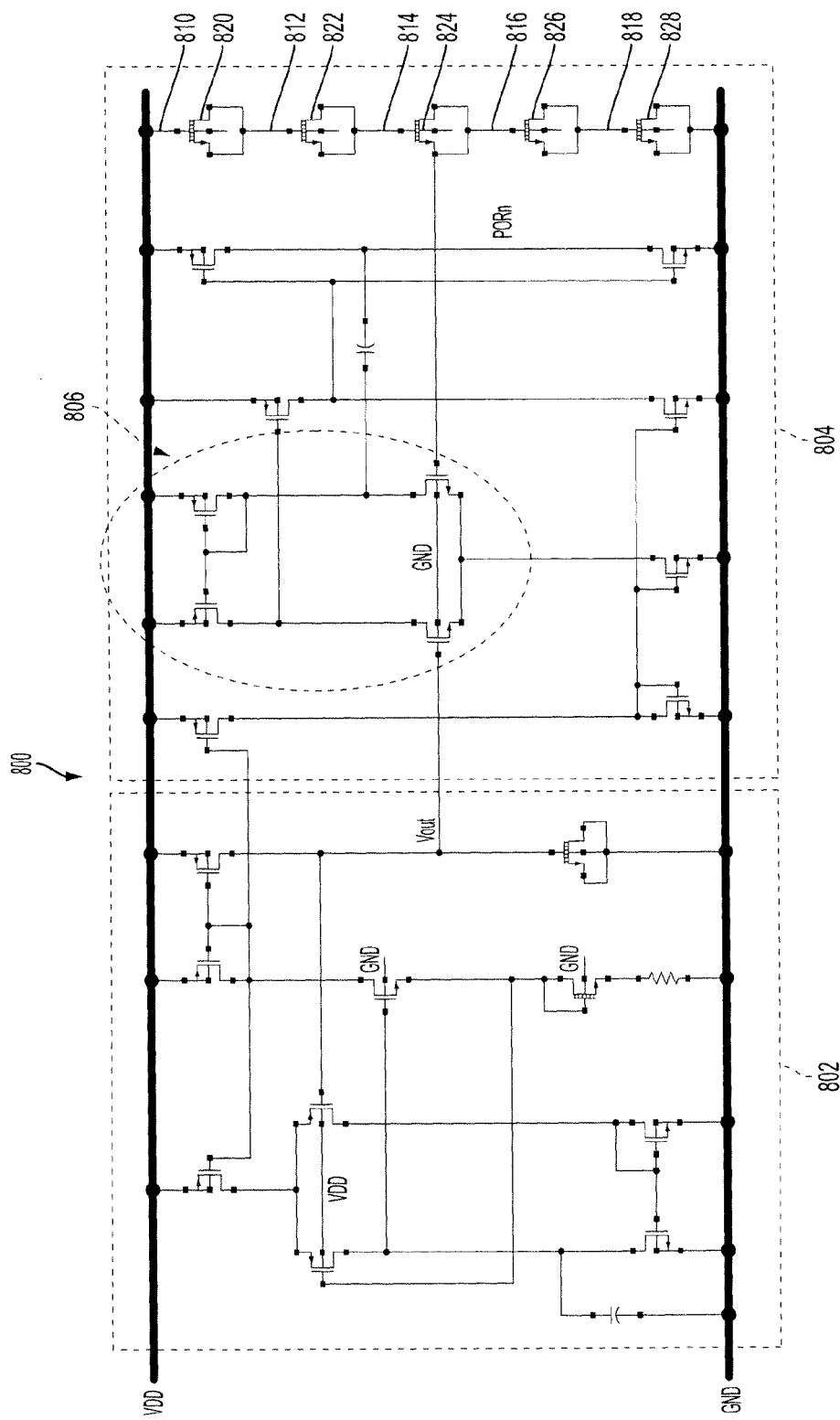
FIG. 8A is a schematic diagram illustrating an embodiment of a power-on reset circuit including the low-power voltage reference circuit of FIG. 5A.
Figure 8B:
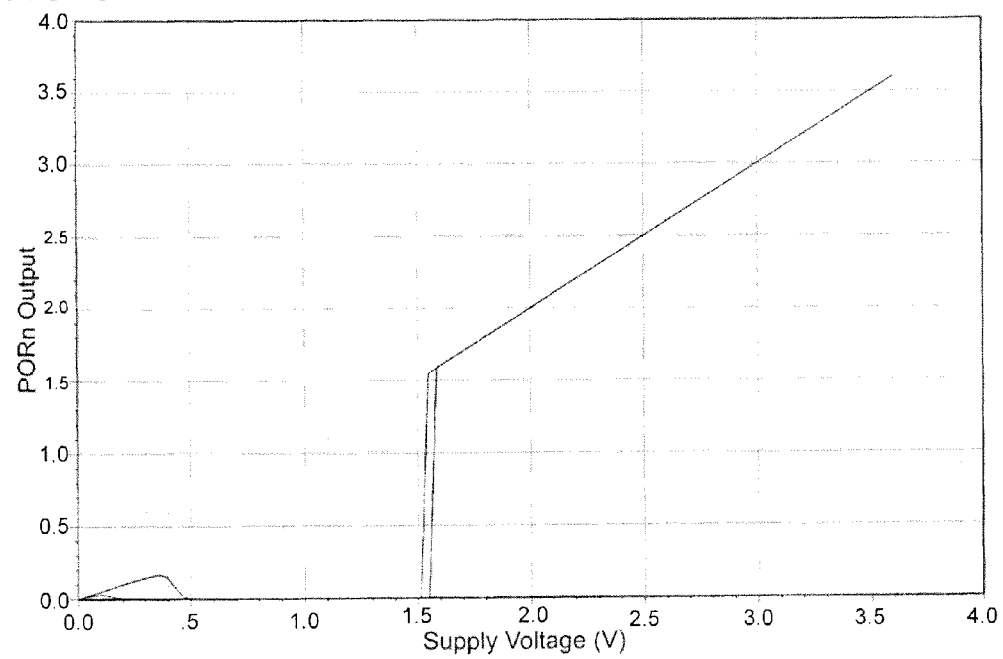
FIG. 8B is a graph illustrating simulated output state of the power-on-reset circuit of FIG. 8A as voltage supply amplitude is varied.

In some embodiments a power-on-reset circuit uses a gate leakage-current to gate voltage characteristic of an ultra-thin dielectric layer component to determine when a power supply has reached a particular threshold voltage level. FIG. 8A is a schematic diagram illustrating an embodiment of a power-on reset circuit 800 using an ultra-thin dielectric layer component based reference circuit. In the example shown, reference 802 is coupled to supply-voltage comparator 804. Ultra-thin dielectric layer components 820, 822, 824, 826, and 828 are arranged in series between the power supply nodes VDD and GND (or a lower power supply node VSS) to provide an ultra-low current voltage divider at an output node of the comparator 804. In some embodiments, additional (or fewer) ultra-thin dielectric layer components are included in the series interconnection to provide additional (or fewer) voltage divider reference levels. As shown in FIG. 8A, components 820, 822, 824, 826, and 828 are core (1.2V) NMOS ultra-thin dielectric layer transistor components fabricated in a 65 nm process; however, in other embodiments, other types of ultra-thin dielectric layer components may be used. At low frequencies, upon applying a power supply voltage to the series coupling of components 820, 822, 824, 826, and 828, a gate leakage current flows through the dielectric layers of the series interconnection of components to set the voltage at inter-component nodes or taps 810, 812, 814, 816, and 818 as a fraction of the supply voltage (i.e., in the example shown, integer fractions of the difference between the upper power supply voltage and lower power supply voltage (i.e., ground in the example of circuit 800) such that $V_{818}$=VDD/5; $V_{816}$=2*VDD/5; $V_{814}$=3*VDD/5, and $V_{812}$=4*VDD/5). At higher frequencies, the gate capacitance acts to divide the voltage, providing a zero in the frequency response from the supply to the taps. The inter-component nodes or taps 810, 812, 814, 816, and 818 serve as voltage-divider output nodes. Tap 816 is connected to comparator 806 to detect when the power-on-reset threshold (corresponding to the voltage potential $V_{816}$ at node 816) has been crossed or exceeded. In various embodiments, the size and number of components in the voltage divider are chosen with consideration of the maximum gate voltage allowed for reliability; the maximum desired current in the voltage divider; the fractional step size of the taps; parasitic layout capacitance; parasitic junction leakage current. FIG. 8B is a graph illustrating simulated output state as supply is varied. In the example shown, the threshold of PORn vs. supply as temperature is stepped from −40 to 85 C changes by only about 35 mV.

In some embodiments, a voltage supervisor circuit outputs a power on reset signal as well as one or more voltage threshold signals by comparing different taps of the voltage divider with a reference voltage. In some embodiments, a voltage threshold signal is used as a brownout detector. In some embodiments, two or more thresholds are used to generate hysteresis in the power-on-reset circuit so that a power-on-reset signal occurs until a first threshold is crossed in a positive going direction. In the negative going direction, the supply has to cross a second, lower threshold to assert power-on-reset after the first threshold is crossed. Hysteresis in this fashion is helpful to prevent a limit cycle from forming as the device draws current coming out of reset.

In some embodiments, a plurality of thresholds is used in a supply supervisor for an energy-scavenged device. A scavenger such as a solar cell provides a small amount of current to charge a capacitor until a voltage threshold is crossed. In response to the threshold being crossed, the supply supervisor initiates a sequence of events to perform a desired operation which may include one or more of: measurement of a parameter from a transducer such as temperature; sending a data packet by a radio transmitter; listening for a data packet by a radio receiver; incrementing a nonce stored in a nonvolatile memory; actuating a device; or any other appropriate action or combination of actions. By monitoring the available energy stored in the capacitor using the capacitor voltage, the supply supervisor can ensure that a sufficient amount of energy to complete a desired operation has accumulated on the capacitor before initiating the operation. An ultra-low power supervisor circuit is advantageous because only a tiny portion of the scavenged energy is required for supply supervision.

In some embodiments, energy is scavenged via a photoelectric cell constructed from one or more P-N junctions fabricated on the same piece of silicon as the voltage supervisor chip. To prevent other portions of the integrated circuit from being adversely affected by incident light, a light shield may be constructed using one or more layers of metal over the sensitive portions of the circuit. An optically transparent or translucent plastic, such as a type of plastic suitable for packaging light-emitting-diodes, may be used to encapsulate and protect the integrated circuit from the environment (such as moisture or ionic contamination) while allowing light energy to reach the photoelectric cell.

In some embodiments, a 1 mm×1 mm area is allocated for a photoelectric cell on the same piece of silicon as the voltage supervisor. Assuming an efficiency of 10%, the photoelectric cell will generate about 50 nW of power with typical office lighting. If 10 nW is allocated for voltage supervision, this would allow a radio, such as Dust Networks' LPZ600 (which consumes approximately 30 uJ to transmit a packet from power off) to measure temperature and send a packet containing this information approximately every 10 minutes using only the energy collected by incident light on the silicon chip. In some embodiments, a portion or all of the functionality of a device such as Dust Networks' LPZ600 is integrated on the same piece of silicon as a photoelectric cell and a low-power voltage supervisor.

In some embodiments, an oscillator output is used to provide a switched-cap resistor in place of a resistive element, for example device 522. A switched-cap resistor is beneficial in terms of size for large resistances. Switched-cap design is well known by those skilled in the art.

In various embodiments, PMOS devices are used instead of NMOS devices; NMOS devices are used instead of PMOS devices; the drain and source voltage of a transistor-type component 120 are of similar potential and/or coupled to each other; the drain and source voltage of a transistor-type component 120 are of different potential; the body terminal of a transistor-type component 120 is of a similar potential to (and/or coupled to) a drain and/or source terminal; the body terminal of a transistor-type component 120 is of a different potential than a drain or source terminal; the body terminal of a transistor-type component 120 is connected to ground; the body terminal of a transistor-type component 120 is connected to a positive power supply voltage; only one of the source, drain, and body terminals is connected and the other terminals remain floating.

In some embodiments, a MOSCAP with an ultra-thin gate oxide (such as a core gate oxide in a 65 nm process) is used in place of or in conjunction with a transistor-type component 120. In some embodiments, a MOSCAP is constructed with a first terminal of n-type silicon under a dielectric layer and a second terminal of polysilicon on top of the dielectric layer. In some embodiments, a MOSCAP is constructed with a first terminal of p-type silicon under a dielectric layer and a second terminal of polysilicon on top of the dielectric layer.

In some embodiments, one or more references, oscillators, and voltage supervisor circuits are included on a single integrated circuit to provide power management. In some embodiments the circuit techniques and circuits described herein are used to provide a voltage, current, or timing reference.

In various embodiments, the gate is separated from the substrate by a dielectric including silicon dioxide; the gate is separated from the substrate by a dielectric including a silicon oxide that is not a 1:2 ratio of silicon to oxygen; the gate is separated from the substrate by a dielectric including a silicon nitride; the gate is separated from the substrate by a dielectric including a Hafnium Oxide; or the gate is separated from the substrate by any other appropriate dielectric.

A detailed description of one or more embodiments of the invention has been provided above along with accompanying figures that illustrate the principles of the invention. The invention is described in connection with such embodiments, but the invention is not limited to any embodiment. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A circuit comprising:
   a component having a first terminal, a second terminal, and an ultra-thin dielectric layer disposed between the first and second terminals such that the first and second terminals contact the dielectric layer and are physically separated from each other; and
   driving circuitry including at least one transistor and operative to apply a voltage to the first terminal of the component with respect to the second terminal of the component in order to cause a current to flow through the dielectric layer,
   wherein the current flow through the dielectric layer while the driving circuitry is in operation is unidirectional, and
   wherein the driving circuitry further includes an impedance device controlling the voltage applied by the driving circuitry to the first terminal of the component and operative to cause the voltage applied by the driving circuitry to the first terminal of the component to vary with temperature so as to compensate for variations in the current through the component over temperature.

2. The circuit of claim 1, wherein:
   the ultra-thin dielectric layer has a thickness of 3 nm or less;
   the first and second terminals are formed on opposite sides of the ultra-thin dielectric layer and are spaced apart from each other by the thickness of the dielectric layer.

3. The circuit of claim 1, wherein the current flow through the dielectric layer is caused by tunneling of charge carriers across the dielectric layer from one of the first and second terminals to the other of the first and second terminals.

4. The circuit of claim 1, wherein the ultra-thin dielectric layer is formed of at least one of silicon dioxide, silicon nitride, a high-k dielectric material, a low-k dielectric material, hafnium silicate, zirconium silicate, hafnium dioxide, and zirconium dioxide.

5. The circuit of claim 1, wherein the component is one of:
a transistor, wherein the first terminal is a gate terminal of the transistor, the second terminal is a channel region of the transistor, and the ultra-thin dielectric layer is an ultra-thin gate oxide layer of the transistor;
an integrated circuit structure comprising an n-doped region, wherein a first surface of the ultra-thin dielectric layer contacts the n-doped region, the first terminal is on a second surface of the dielectric layer opposite the first surface, and the second terminal comprises the n-doped region;
an integrated circuit structure comprising a p-doped region, wherein a first surface of the ultra-thin dielectric layer contacts the p-doped region, the first terminal is on a second surface of the dielectric layer opposite the first surface, and the second terminal comprises the p-doped region; and
a capacitor structure, wherein the first and second terminals are conductive plates contacting opposite surfaces of the ultra-thin dielectric layer.

6. The circuit of claim 1, wherein the current flow through the dielectric layer flows in the unidirectional direction from the driving circuitry through the first terminal of the component, through the dielectric layer, and through the second terminal of the component.

7. The circuit of claim 1, wherein the driving circuitry comprises:
a current mirror coupled to the first terminal of the component and configured to output, at a current mirror output node, a reference output current that is based on the current flow through the dielectric layer, wherein the current mirror includes the at least one transistor.

8. The circuit of claim 7, wherein the current mirror comprises:
a diode-connected first transistor of the at least one transistor having a first gate terminal and a first drain terminal coupled to the first terminal of the component, and having a first source terminal coupled to a first power supply node; and
a second transistor of the at least one transistor having a second gate terminal coupled to the first terminal of the component, and a second source terminal coupled to the first power supply node,
wherein the second terminal of the component is coupled to a second power supply node, and
wherein the current mirror sources the reference output current at a drain terminal of the second transistor.

9. A circuit comprising:
a component having a first terminal, a second terminal, and an ultra-thin dielectric layer disposed between the first and second terminals such that the first and second terminals contact the dielectric layer and are physically separated from each other; and
a current source coupled to the component, including at least one transistor, and configured to apply a current to the first terminal of the component to cause the current to flow from the first terminal through the dielectric layer to the second terminal,
wherein the component provides a reference output voltage between the first and second terminals in response to the current flow through the dielectric layer, and
wherein the current source further includes an impedance device controlling the current applied by the current source to the first terminal of the component and operative to cause the current applied by the current source to the first terminal of the component to vary with temperature so as to compensate for variations in the reference output voltage across the component over temperature.

10. The circuit of claim 9, wherein:
the ultra-thin dielectric layer has a thickness of 3 nm or less;
the first and second terminals are formed on opposite sides of the ultra-thin dielectric layer and are spaced apart from each other by the thickness of the dielectric layer.

11. The circuit of claim 9, wherein the current flow through the dielectric layer is caused by tunneling of charge carriers across the dielectric layer from one of the first and second terminals to the other of the first and second terminals.

12. The circuit of claim 9, wherein the ultra-thin dielectric layer is formed of at least one of silicon dioxide, silicon nitride, a high-k dielectric material, a low-k dielectric material, hafnium silicate, zirconium silicate, hafnium dioxide, and zirconium dioxide.

13. The circuit of claim 9, wherein the component is one of:
a transistor, wherein the first terminal is a gate terminal of the transistor, the second terminal is a channel region of the transistor, and the ultra-thin dielectric layer is an ultra-thin gate oxide layer of the transistor;
an integrated circuit structure comprising an n-doped region, wherein a first surface of the ultra-thin dielectric layer contacts the n-doped region, the first terminal is on a second surface of the dielectric layer opposite the first surface, and the second terminal comprises the n-doped region;
an integrated circuit structure comprising a p-doped region, wherein a first surface of the ultra-thin dielectric layer contacts the p-doped region, the first terminal is on a second surface of the dielectric layer opposite the first surface, and the second terminal comprises the p-doped region; and
a capacitor structure, wherein the first and second terminals are conductive plates contacting opposite surfaces of the ultra-thin dielectric layer.

14. The circuit of claim 9, wherein the impedance device includes at least one of a resistor, an interconnection of a resistor and a diode-connected transistor, and an interconnection of a resistor and a source follower transistor.

15. A circuit comprising:
a component having a first terminal, a second terminal, and an ultra-thin dielectric layer disposed between the first and second terminals such that the first and second terminals contact the dielectric layer and are physically separated from each other; and
a current source coupled to the component and configured to apply a current to the first terminal of the component to cause the current to flow from the first terminal through the dielectric layer to the second terminal,
wherein the component provides a reference output voltage between the first and second terminals in response to the current flow through the dielectric layer,
wherein the current source comprises:
a first transistor having a first drain terminal coupled to the first terminal of the component, and having a first source terminal coupled to a first power supply node;

a diode-connected second transistor having a second gate terminal and a second drain terminal coupled to a first gate terminal of the first transistor, and a second source terminal coupled to the first power supply node;

a source-follower third transistor having a third drain terminal coupled to the first gate terminal of the first transistor, and a third gate terminal coupled to the first terminal of the component; and an impedance device coupled between a third source terminal of the third transistor and a second power supply node, wherein the second terminal of the component is coupled to the second power supply node, and wherein the component provides the reference output voltage at the first terminal.

16. A circuit comprising:

a component having a first terminal, a second terminal, and an ultra-thin dielectric layer disposed between the first and second terminals such that the first and second terminals contact the dielectric layer and are physically separated from each other; and a current source coupled to the component and configured to apply a current to the first terminal of the component to cause the current to flow from the first terminal through the dielectric layer to the second terminal, wherein the component provides a reference output voltage between the first and second terminals in response to the current flow through the dielectric layer, wherein the current source comprises:

a differential amplifier circuit having a first input coupled to the first terminal of the component; and an impedance coupled at an output of the differential amplifier, wherein the output of the differential amplifier is configured to control the current source such that a voltage across the impedance tracks the reference output voltage at the first terminal of the component.

17. The circuit of claim 16, wherein the current source comprises:

a first transistor having a first drain terminal coupled to the first terminal of the component, and having a first source terminal coupled to a first power supply terminal;

a diode-connected second transistor having a second gate terminal and a second drain terminal coupled to a first gate terminal of the first transistor, and a second source terminal coupled to the first power supply terminal; and a third transistor having a third drain terminal coupled to the first gate terminal of the first transistor, and a third source terminal coupled to the impedance, wherein the differential amplifier circuit has a second input coupled to the third source terminal and to the impedance, and the output coupled to a third gate terminal of the third transistor, wherein the impedance is coupled between the third source terminal of the third transistor and a second power supply node, wherein the second terminal of the component is coupled to the second power supply node, and wherein the component provides the reference output voltage between the first terminal and the second terminal of the component.

18. The circuit of claim 17, wherein the impedance comprises:

a fourth transistor having a fourth gate terminal and a fourth drain terminal; and a resistor coupled to the fourth transistor.

19. The circuit of claim 18, wherein the fourth transistor is an ultra-thin dielectric transistor having a gate oxide formed of an ultra-thin dielectric layer.

20. A circuit comprising:

a component having a first terminal, a second terminal, and an ultra-thin dielectric layer disposed between the first and second terminals such that the first and second terminals contact the dielectric layer and are physically separated from each other; and a current source coupled to the component and configured to apply a current to the first terminal of the component to cause the current to flow from the first terminal through the dielectric layer to the second terminal, wherein the component provides a reference output voltage between the first and second terminals in response to the current flow through the dielectric layer, and wherein the circuit further comprises at least one of:

an oscillator circuit coupled to the first terminal of the component, wherein the oscillator circuit comprises a current reference generator circuit coupled to the first terminal and configured to generate a stable current reference based on the reference output voltage provided by the component, and circuitry configured to generate an oscillator output signal by cyclically charging a capacitor using the stable current reference; and a power-on-reset circuit coupled to the first terminal of the component and configured to generate a power-on-reset output signal in response to detecting that a power supply level or a fraction of the power supply level exceeds the reference output voltage at the first terminal of the component.

* * * * *